United States Patent
Matthews et al.

(10) Patent No.: US 7,425,834 B2
(45) Date of Patent: Sep. 16, 2008

(54) METHOD AND APPARATUS TO SELECT A PARAMETER/MODE BASED ON A TIME MEASUREMENT

(75) Inventors: David Michael Hugh Matthews, Sunnyvale, CA (US); Alex B. Djenguerian, Saratoga, CA (US); Kent Wong, Fremont, CA (US); Balu Balakrishnan, Saratoga, CA (US)

(73) Assignee: Power Integrations, Inc., San Jose, CA (US)

( * ) Notice: Subject to any disclaimer, the term of this patent is extended or adjusted under 35 U.S.C. 154(b) by 114 days.

(21) Appl. No.: 11/213,252

(22) Filed: Aug. 26, 2005

(65) Prior Publication Data

US 2007/0046294 A1 Mar. 1, 2007

(51) Int. Cl.
*G01R 31/12* (2006.01)
(52) U.S. Cl. .................. 324/548; 324/658
(58) Field of Classification Search ........... 324/548
See application file for complete search history.

(56) References Cited

U.S. PATENT DOCUMENTS

| | | | | |
|---|---|---|---|---|
| 5,585,733 | A * | 12/1996 | Paglione | 324/678 |
| 6,424,156 | B1 * | 7/2002 | Okamura | 324/426 |
| 7,112,978 | B1 * | 9/2006 | Koniaris et al. | 324/763 |
| 2005/0156588 | A1 * | 7/2005 | Petr | 324/117 R |
| 2005/0270042 | A1 * | 12/2005 | Doljack | 324/686 |

OTHER PUBLICATIONS

"Current-Mode PWM Controller, UC3842," Product Specification, Phillips Semiconductors Linear Products, Aug. 31, 1994, pp. 1100-1107.
"TOP242-250, TOPSwitch®-GX Family, Extended Power, Design Flexible, EcoSmart®, Integrated Off-line Switcher," Power Integrations, Inc., Sep. 2002, pp. 1-52.
"TNY263-268, TinySwithc®-II Family, Enhanced, Energy Efficient, Low Power Off-line Switcher," Power Integrations, Inc., Apr. 2005, pp. 1-24.

* cited by examiner

*Primary Examiner*—Diego Gutierrez
*Assistant Examiner*—Jeff Natalini
(74) *Attorney, Agent, or Firm*—Blakely Sokoloff Taylor & Zafman LLP

(57) ABSTRACT

Techniques are disclosed to select functional parameters and/or operating modes of a circuit based on a time measurement are disclosed. One example integrated circuit includes a threshold detection and timing circuit that is coupled to measure a signal during an initialization period of the integrated circuit from a multifunction capacitor that is to be coupled to a first terminal of the integrated circuit. A selection circuit is coupled to the threshold detection and timing circuit to select a parameter/mode of the integrated circuit in response to the measured signal from the multifunction capacitor during the initialization period of the integrated circuit. The multifunction capacitor is coupled to provide an additional function for the integrated circuit after the initialization period of the integrated circuit is complete.

23 Claims, 6 Drawing Sheets

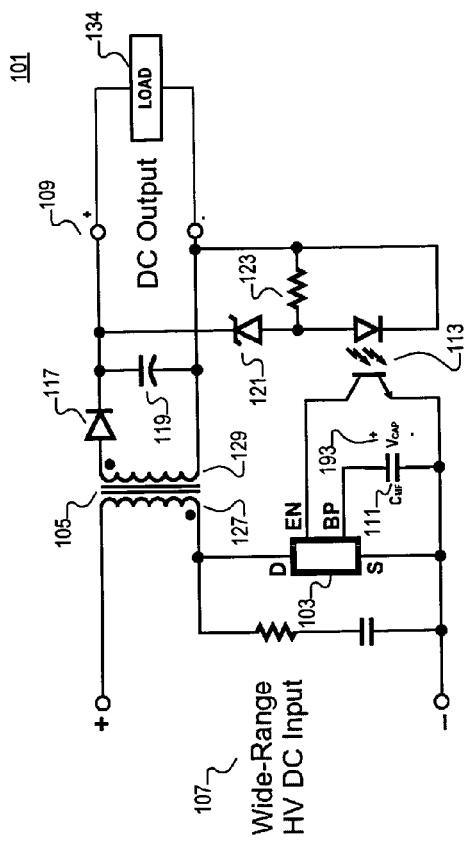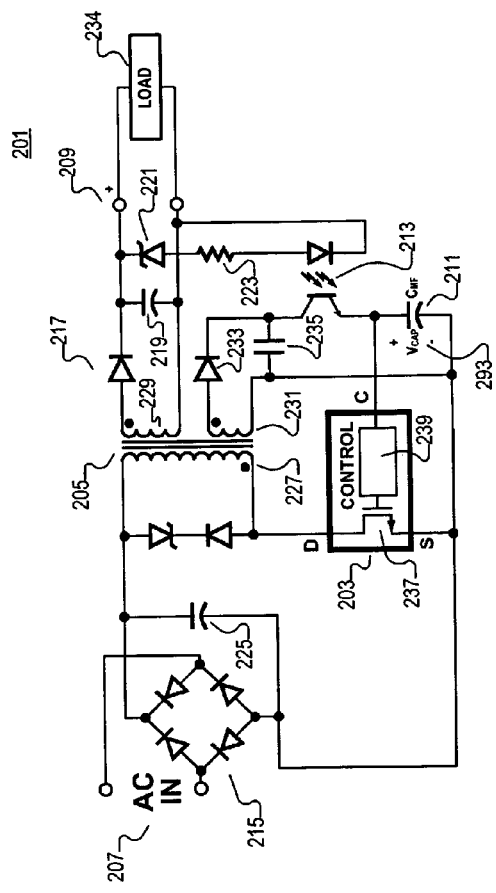

METHOD AND APPARATUS TO SELECT A PARAMETER/MODE BASED ON A TIME MEASUREMENT

BACKGROUND

1. Technical Field

The present invention relates generally to electronic circuits, and more specifically, the invention relates to integrated circuits in which functional parameters and/or operating modes are set.

2. Background Information

Integrated circuits may be used for a multitude of purposes and applications. In order to provide increased flexibility, circuit designers sometimes design the integrated circuits have a variety of different operating modes and/or have the ability to function with a variety of different operating parameters. In order for the different functional parameters and/or operating modes to be set in the integrated circuit, the integrated circuit chip is typically designed and manufactured with an additional one or more pins in the packaging to which additional circuit elements or signals could be coupled in order to set or select the desired functional parameters and/or operating modes of the integrated circuit. In the alternative, a separate product part could be designed or manufactured with a different integrated circuit for each particular functional parameter and operating mode setting designed directly into the circuitry of the integrated circuit.

BRIEF DESCRIPTION OF THE DRAWINGS

The present invention detailed illustrated by way of example and not limitation in the accompanying Figures.

FIG. 1 is a schematic for an embodiment of an integrated circuit included in a power supply in which a parameter/mode is set based on a time measurement in accordance with the teaching of the present invention.

FIG. 2 is another schematic for an embodiment of an integrated circuit included in a power supply which a parameter/mode is set based on a time measurement in accordance with the teaching of the present invention.

DETAILED DESCRIPTION

Figure 3:
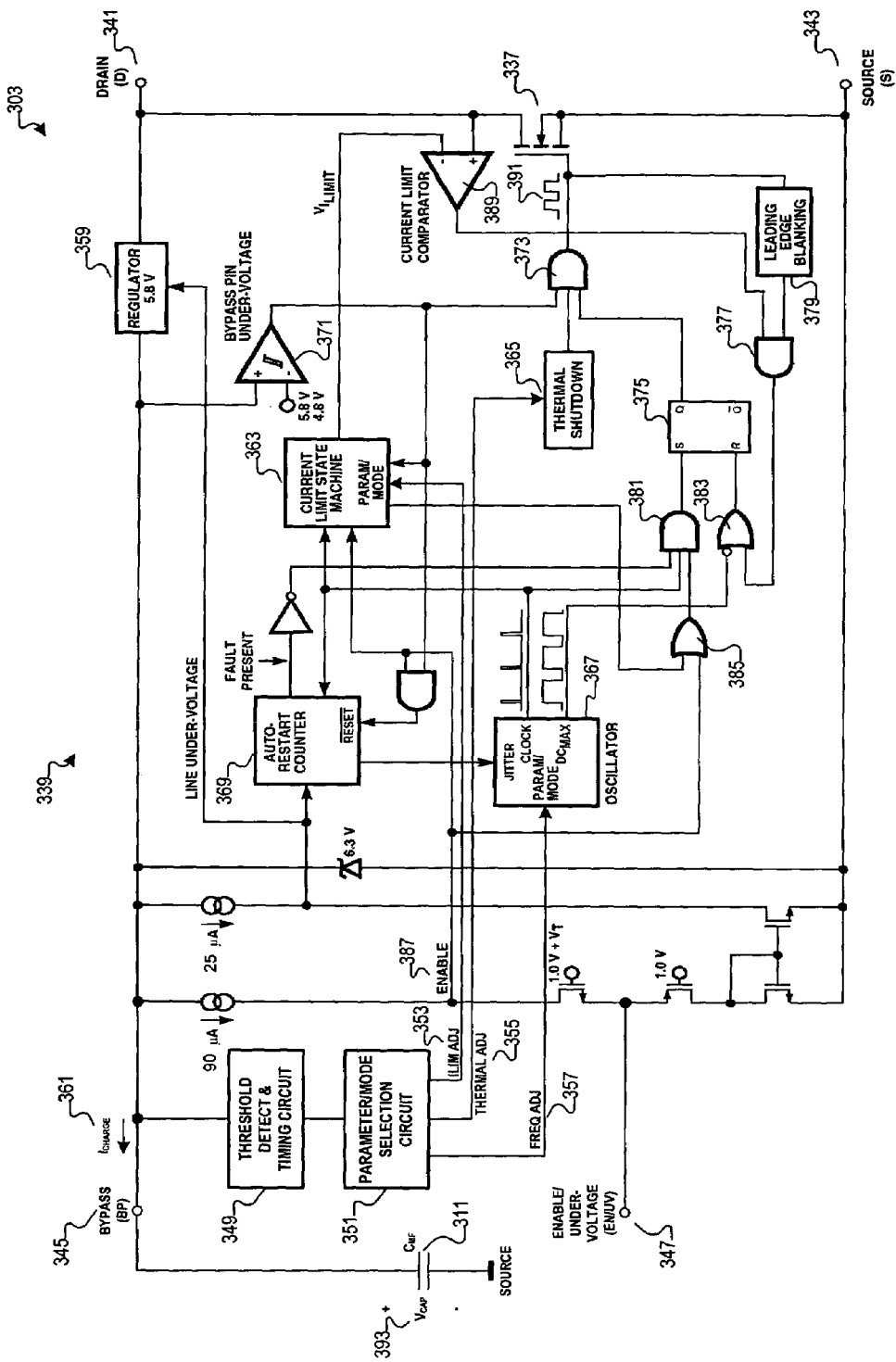
FIG. 3 is a schematic for an embodiment of an integrated circuit coupled to a multifunction capacitor from which a signal is measured during initialization to select a parameter/mode in accordance with the teaching of the present invention.

Embodiments of an integrated circuit in which a time measurement is utilized to set a parameter/mode are disclosed. In the following description, numerous specific details are set forth in order to provide a thorough understanding of the present invention. It will be apparent, however, to one having ordinary skill in the art that the specific detail need not be employed to practice the present invention. Well-known methods related to the implementation have not been described in detail in order to avoid obscuring the present invention.

Reference throughout this specification to "one embodiment" or "an embodiment" means that a particular feature, structure, or characteristic described in connection with the embodiment is included in at least one embodiment of the present invention. Thus, the appearances of the phrases "for one embodiment" or "in an embodiment" in various places throughout this specification are not necessarily all referring to the same embodiment.

Furthermore, the particular features, structures, characteristics, combinations and/or subcombinations described below and/or shown in the drawings may be combined in any suitable manner in one or more embodiments in accordance with the teachings of the present invention.

As will be discussed, functional parameters or operating modes may be selected during a mode selection or functional parameter specification setting period during the initialization period for an embodiment of an integrated circuit in accordance with the teachings of the present invention. For one embodiment, the costs associated with either having additional dedicated pins on the chip package or having separate product part numbers for the purpose of addressing various different device functional parameter specifications or operating modes is saved. For instance, device functional parameter specifications may instead be selected using an existing pin by measuring the time needed to change the voltage on that pin with a substantially fixed or known predetermined current, or by measuring the current needed to change the voltage on that pin by a certain voltage in a fixed time.

Accordingly, selecting from a plurality of functional parameters and/or operating modes may be provided with a single part by choosing for example a capacitance value of a multifunction capacitor coupled to a pin of the integrated circuit, wherein during normal operation, the multifunction capacitor has a normal function of something other than setting functional parameters, operating modes or other device characteristics. For example, the same $V_{cc}$ pin decoupling capacitor or a feedback pin loop compensation capacitor used during normal integrated circuit operation may be employed as a parameter/mode selecting capacitor during initialization as well in accordance with the teachings of the present invention.

To illustrate, FIG. 1 shows an example integrated circuit included in a power supply in which a parameter/mode is set based on a time measurement in accordance with the teaching of the present invention. The topology of the power supply illustrated in FIG. 1 is known as a flyback regulator. It is appreciated that there are many topologies and configurations of switching regulators, and that the flyback topology shown in FIG. 1 is provided to illustrate the principles of an embodiment of the present invention that may apply also to other types of topologies in accordance with the teachings of the present invention.

In FIG. 1, power supply 101 includes an energy transfer element 105 coupled between an input 107 and an output 109 of the power supply 101. The example energy transfer element 105 shown is a transformer having two windings including primary winding 127 at the input and secondary winding 129 at the output. In other examples, the energy transfer element 105 may include a different number of windings in accordance with the teachings of the present invention. In the illustrated example, input 107 is an unregulated wide-range high voltage (HV) direct current (DC) input and output 109 is a DC output coupled to a load 134. Load 134 may be a fixed load or may be a load with varying magnitude.

As shown, an integrated circuit 103 is coupled to primary winding 127. For one embodiment, integrated circuit 103 is a switching regulator including an internal switch coupled between the drain D and source S terminals of integrated circuit 103. An internal controller circuit is also included in the example in integrated circuit 103 to control the switching of the switch. In another example, it is noted that the internal switch could also be an external switch that is separate from the integrated circuit 103 in accordance with the teachings of the present invention.

In operation, the switch in integrated circuit 103 is switched to regulate the transfer of energy from the input 107 to the output 109 through the energy transfer element 105. For one embodiment, the operation of the switch in integrated circuit 103 of FIG. 1 produces pulsating current in the rectifier diode 117 at the output, which is filtered by capacitor 119 to produce a substantially constant output voltage at DC output 109 or a substantially constant output current at the load 134. A feedback circuit including Zener diode 121 and resistor 123 at output 109 is used to provide a feedback signal through optocoupler 113 to integrated circuit 103. Optocoupler 113 provides some isolation between the input 107 and output 109 of the power supply 101. As shown in the illustrated example, integrated circuit 103 receives the feedback signal from the output 109 through the enable EN terminal. The feedback signal received through the EN terminal is used by integrated circuit 103 to regulate the output 109 of power supply 101 in accordance with the teachings of the present invention.

For one embodiment, a multifunction capacitor $C_{MF}$ 111 is also coupled to the bypass BP terminal of integrated circuit 103. In the illustrated example, multifunction capacitor $C_{MF}$ 111 is utilized to provide a supply decoupling function for integrated circuit 103 during normal operation. For example, the internal circuitry within integrated circuit 103 receives power or a bias current from multifunction capacitor $C_{MF}$ 111 to operate the circuitry during normal operation while regulating output 109.

As will be discussed, an additional function of multifunction capacitor $C_{MF}$ 111 in the example of FIG. 1 is that it is utilized by integrated circuit 103 to select a parameter/mode for integrated circuit 103 during an initialization period in accordance with the teachings of the present invention. Examples of functional parameters and/or operating modes that may be selected during this initialization period include peak current limit level, operating frequency, maximum operating frequency, thermal shutdown threshold or the like. After the parameter/mode is selected during initialization, multifunction capacitor $C_{MF}$ 111 is utilized for the other functions during normal operation of integrated circuit 103 in accordance with the teachings of the present invention.

FIG. 2 is an illustration of another example schematic for an embodiment of an integrated circuit included in a power supply which a parameter/mode is set based on a time measurement in accordance with the teaching of the present invention. As shown, power supply 201 of FIG. 2 shares similarities with the power supply 101 of FIG. 1. For instance, power supply 201 includes an energy transfer element 205 coupled between an input 207 and an output 209 of the power supply 201. The example energy transfer element 205 shown is a transformer having three windings including primary winding 227 at the input, a secondary winding 229 at the output and a bias winding 231. In the illustrated example, a rectifier 215 is coupled to receive and rectify the alternating current (AC) signal from input 107 and generate a rectified signal that is filtered with capacitor 225 to provide an unregulated HV DC input signal to the primary winding 227. The output 209 is coupled to a load 234, which may be a fixed load or may be a load with varying magnitude in accordance with the teachings of the present invention.

In the example illustrated in FIG. 2, integrated circuit 203 is a switching regulator including an internal switch 237 coupled between the drain D and source S terminals of integrated circuit 203. An internal controller circuit 239 is also included in the example in integrated circuit 203 to control the switching of the switch. In another example, it is noted that the internal switch 237 could also be an external switch that is separate from the integrated circuit 203 in accordance with the teachings of the present invention.

In operation, the switch 237 in integrated circuit 203 is switched to regulate the transfer of energy from the input 207 to the output 209 through the energy transfer element 205. For one embodiment, the operation of the switch 237 produces pulsating current in the rectifier diode 217 at the output, which is filtered by capacitor 219 to produce a substantially constant output voltage at output 209 or a substantially constant output current at the load 234. A feedback circuit including Zener diode 221 and resistor 223 at output 209 is used to provide a feedback signal through optocoupler 213 to integrated circuit 203. A bias current is provided to optocoupler 213 from bias winding 231. The bias current is rectified with rectifier diode 233 and filtered with capacitor 235. Optocoupler 213 provides some isolation between the input 207 and output 209 of the power supply 201. As shown in the illustrated example, integrated circuit 103 receives the feedback signal from the output 209 through the control C terminal. The feedback signal received through the control C terminal is used by integrated circuit 203 to regulate the output 209 of power supply 201 in accordance with the teachings of the present invention.

For one embodiment, a multifunction capacitor $C_{MF}$ 211 is also coupled to the control C terminal of integrated circuit 103. In the illustrated example, multifunction capacitor $C_{MF}$ 211 is utilized for a plurality of purposes including for example providing an integrated circuit supply decoupling function for integrated circuit 203 as well as feedback loop compensation during normal operation. For example, the internal circuitry within integrated circuit 203 receives power or a bias current from multifunction capacitor $C_{MF}$ 211 through the control C terminal to operate the circuitry during normal operation while regulating output 209.

As will be discussed, yet another additional function of multifunction capacitor $C_{MF}$ 211 in the example of FIG. 2 is that it is utilized by integrated circuit 203 to select a parameter/mode for integrated circuit 203 during an initialization period in accordance with the teachings of the present invention. Examples of functional parameters and/or operating modes that may be selected during this initialization period include peak current limit level, operating frequency, maximum operating frequency, thermal shutdown threshold or the like. After the parameter/mode is selected during initialization, multifunction capacitor $C_{MF}$ 211 is utilized for the other functions during normal operation of integrated circuit 203 in accordance with the teachings of the present invention.

FIG. 3 is a schematic for an embodiment of an integrated circuit 303 coupled to a multifunction capacitor 311 from which a signal is measured during initialization to select a parameter/mode in accordance with the teaching of the present invention. As shown in the example of FIG. 3, integrated circuit 303 includes a switch 337 coupled to a controller circuit 339, which is coupled to multifunction capacitor 311 through bypass BP terminal 345 of integrated circuit 303. For one embodiment, controller circuit 339 may include substantially all of the elements shown in FIG. 3 with the exception of switch 337 and multifunction capacitor 311. For one embodiment, integrated circuit 303 includes controller 339 and switch 337. For another-embodiment, switch 337 is not included in integrated circuit 303. For one embodiment, switch 337 is a power metal oxide semiconductor field effect transistor (MOSFET).

It is appreciated that example integrated circuit 303 of FIG. 3 may correspond to integrated circuit 103 of FIG. 1 and also shares many similarities with integrated circuit 203 of FIG. 2 in accordance with the teachings of the present invention. Therefore, elements of the example shown in FIG. 3 may be combined with elements of FIGS. 1 and/or 2 in suitable manners in accordance with the teachings of the present invention. In particular, for one embodiment, drain D terminal 341 is to be coupled to an energy transfer element such as primary winding 127 or 227, source S terminal 343 is to be coupled to ground, enable/undervoltage (EN/UV) terminal 347 is to be coupled to receive a feedback signal from an output of a power supply, such as for example output 109. A multifunction capacitor 311 is coupled between bypass BP terminal 345 and source S terminal 343.

As shown in FIG. 3, integrated circuit 303 includes a threshold detection and timing circuit 349 coupled to measure a signal during an initialization period of the integrated circuit 303 from multifunction capacitor 311. A parameter/mode selection circuit 351 is coupled to the threshold detection and timing circuit 349 to select a parameter/mode of the integrated circuit 303 in response to the signal measured from the multifunction capacitor during the initialization period of the integrated circuit 303. After the initialization period is complete, the multifunction capacitor 311 is used for additional functions by the integrated circuit 303, such as for example integrated circuit supply decoupling and/or loop compensation, as described above in previous examples.

To illustrate, one example of the operation of integrated circuit 303 is as follows. At start-up or during an initialization period, regulator 359, which for one embodiment includes a current source, is coupled to generate a charge current $I_{CHARGE}$ 361. Charge current $I_{CHARGE}$ 361 is coupled to charge multifunction capacitor 311 during the initialization period. As multifunction capacitor 311 is charged during this initialization period, the voltage $V_{CAP}$ 393 rises over time.

Figure 4:
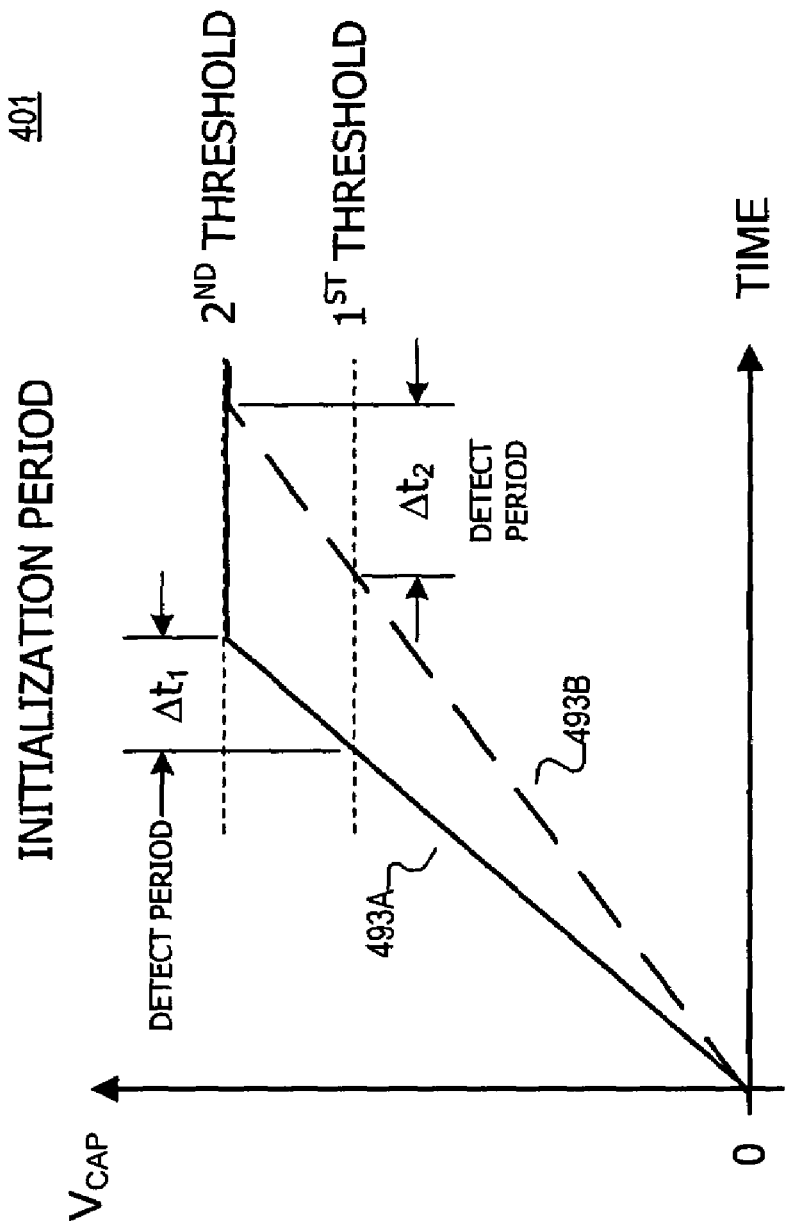
FIG. 4 is a graph showing a time measurement during an initialization period for an embodiment of an integrated circuit in accordance with the teaching of the present invention.

To illustrate, attention is directed to both FIGS. 3 and 4. In particular, FIG. 4 shows a graph 401 that illustrates several examples of the voltage $V_{CAP}$ 393 over time during the initialization period of integrated circuit 303 in accordance with the teachings of the present invention. In particular, plot 493A illustrates voltage $V_{CAP}$ 393 for multifunction capacitor 311 having a first capacitance value and plot 493B illustrates voltage $V_{CAP}$ 393 for multifunction capacitor 311 having a second capacitance value. As can be observed, the rise time of plots 493A and/or 493 change for a given current, such as for example charge current $I_{CHARGE}$ 361.

For one embodiment, as the voltage $V_{CAP}$ 393 rises over time during initialization, threshold detect and timing circuit 349 measures the signal received from multifunction capacitor 311 through bypass BP terminal 345. In particular, threshold detect and timing circuit 349 monitors the voltage $V_{CAP}$ 393 and measures the time period between when the voltage $V_{CAP}$ 393 reaches the first threshold voltage and when the voltage $V_{CAP}$ 393 reaches the second threshold voltage. As can be observed in example FIG. 4, the time measurement for voltage $V_{CAP}$ 393 to rise in plot 493A from the first threshold to the second threshold is $\Delta t_1$. In contrast, the time measurement for voltage $V_{CAP}$ 393 to rise in plot 493B from the first threshold to the second threshold is $\Delta t_2$. As shown, the measured time period $\Delta t_2$ is greater than the measured time period $\Delta t_1$. This is because the capacitance value of multifunction capacitor 311 in plot 493B is greater than the capacitance value of multifunction capacitor 311 in plot 493A. Indeed, the capacitance value of multifunction capacitor 311 can be estimated by measuring the time period as described in accordance with the teachings of the present invention. Therefore, the particular capacitance value of multifunction capacitor 311 coupled to bypass BP terminal 345 may be estimated by threshold detect and timing circuit 349 by measuring the time period as shown in accordance with the teachings of the present invention. In this example, regulator 339 maintains the voltage $V_{CAP}$ 393 at the second threshold during normal operation.

Referring back to FIG. 3, parameter/mode selection circuit 351 is coupled to threshold detect and timing circuit 349 and generates parameter/mode selection signals for integrated circuit 303 in response to the time period measured or capacitance value estimated by threshold detect and timing circuit 349 in accordance with the teachings of the present invention. In the example illustrated in FIG. 3, parameter/mode selection circuit 351 selects specific settings for a current limit adjust signal ILIM ADJ 353, a thermal shutdown threshold signal THERMAL ADJ 355 and a frequency adjust signal FREQ ADJ 357 in response to the measured time period. ILIM ADJ 353 is coupled to current limit state machine 363, THERMAL ADJ 355 is coupled to thermal shutdown circuit 365 and FREQ ADJ is 357 is coupled to oscillator 367. For one embodiment, ILIM ADJ 353 may be used to set the peak current limit level of the current through switch 337. THERMAL ADJ may be used to set the thermal shutdown threshold temperature for integrated circuit 303. FREQ ADJ may be used to set the operating frequency or maximum operating frequency of oscillator 367. For one embodiment, the operating frequency of oscillator 367 may be fixed for one capacitance value of multifunction capacitor 311 and the operating frequency of oscillator 367 may be jittered for another capacitance value of multifunction capacitor 311 in accordance with the teachings of the present invention.

Therefore, the example described above illustrates how a circuit designer can set one or more of all of the above functional parameters and/or operating modes for an embodiment of integrated circuit 303 by appropriately selecting a capacitance value for multifunction capacitor 311 in accordance with the teachings of the present invention. One example benefit provided by this feature may be illustrated by the fact that in a family of integrated circuits, embodiments of the present invention provide the flexibility of allowing the circuit designer to select for example the next biggest or the next smallest device current limit in the family, without having to change the design. For instance, in a family of devices that normally have a fixed current limit, the circuit designer is now allowed to change the capacitance value for multifunction capacitor 311 and select the current limit of the next biggest or the next smallest member of the family of chips. Thus, for example, the $R_{DS}$ value of the switch 337 may be improved or optimized according to the thermal requirements of the particular application by the circuit designer by appropriately selecting the capacitance value for multifunction capacitor 311 in accordance with the teachings of the present invention.

After the initialization period when the functional parameters and/or operating modes are selected in according with the teachings of the present invention, normal operation proceeds in integrated circuit 303, with multifunction capacitor 311 performing other functions for integrated circuit 303 in accordance with the teachings of the present invention. For instance, after the voltage $V_{CAP}$ 393 rises to an adequate level, as determined by bypass pin undervoltage comparator 371, AND gate 373 is enabled to allow drive signal 391 to be output to switch 337 and the auto restart counter 369 is reset accordingly to enable normal operation of integrated circuit 303. During normal operation, switch 337 is switched in response to drive signal 391. If the temperature in integrated circuit 303 becomes excessive according to the setting of THERMAL ADJ 355, thermal shutdown circuit 365 will disable AND gate 373, which will also disable the drive signal 391 from being output to switch 337, which disables switch 337 from switching.

When switch 337 is enabled to switch to regulate a power supply output during normal operation, feedback from the output of the power supply is received through enable/undervoltage EN/UV terminal 347 from which the ENABLE signal 387 is generated. As shown, during normal operation, ENABLE signal 387 is generated using bias current supplied from multifunction capacitor 311 through a current source in accordance with the teachings of the present invention. When the ENABLE signal 387 is active in response to the feedback received from the power supply output, the latch 375 is allowed to be set through AND gate 381 and OR gate 385. Accordingly, the CLOCK signal from the oscillator 367 is allowed to set latch 375, from which drive signal 391 is generated through AND gate 373. Latch 375 is reset in response to the duty cycle max $DC_{MAX}$ signal 367 going low or in response to the current through switch 337 exceeding the peak current limit level as identified by current limit comparator 389 through AND get 377 and OR gate 383. In the illustrated example, leading edge blanking circuit 379 is coupled to temporarily disable a current limit signal during the leading edge of each pulse of the drive signal 391.

As shown, the peak current limit level established by current limit comparator 389 is set in response to the value of $V_{ILIMIT}$, which is output by the current limit state machine 363, which generates $V_{ILIMIT}$ in response to ILIM ADJ 353 in accordance with the teachings of the present invention.

Figure 5:
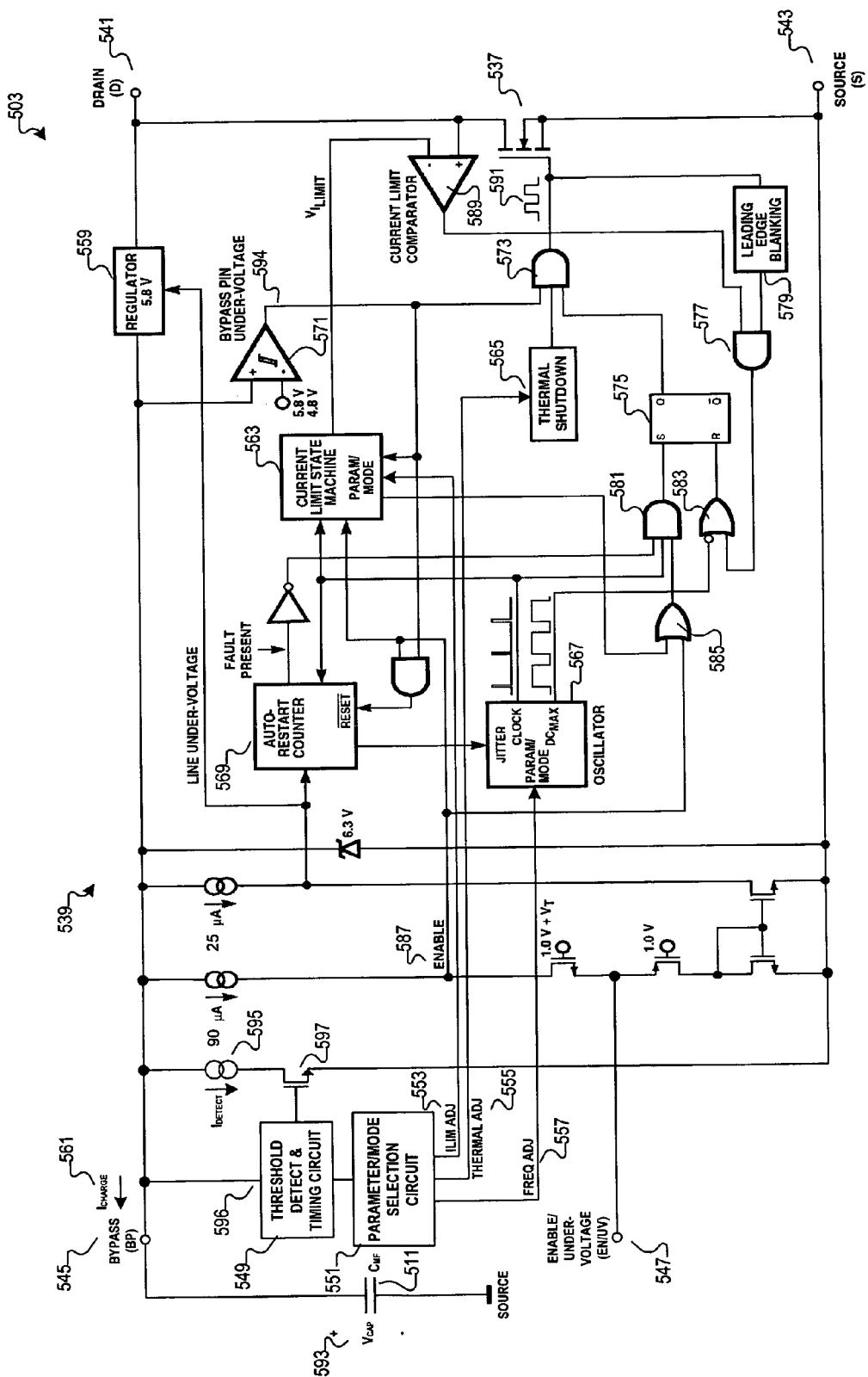
FIG. 5 is another schematic for an embodiment of an integrated circuit coupled to a multifunction capacitor from which a signal is measured during initialization to select a parameter/mode in accordance with the teaching of the present invention.

FIG. 5 is a schematic for another embodiment of an integrated circuit 503 coupled to a multifunction capacitor 511 from which a signal is measured during initialization to select a parameter/mode in accordance with the teaching of the present invention. It is appreciated that integrated circuit 503 shares many similarities with the example integrated circuit 303 illustrated in described above. Accordingly, integrated circuit 303 may be used interchangeably with integrated circuit 503 in suitable combinations is illustrated for example FIGS. 1 and 2 in accordance with the teachings of the present invention.

Indeed, similar to integrated circuit 303, a multifunction capacitor 511 is coupled to integrated circuit 503 through a bypass BP terminal 545. Integrated circuit 503 also includes a switch 537 coupled to a controller circuit 539, which is coupled to multifunction capacitor 511 through bypass BP terminal 545 of integrated circuit 503. Controller circuit 539 of integrated circuit 503 also includes a regulator circuit 559, a bypass pin undervoltage comparator 571, an auto-restart counter 569, a current limit state machine 563, a current limit comparator 589, an oscillator 567, a thermal shutdown circuit 565, a leading edge blanking circuit 579, a latch 575 and other associated circuitry. Operation of integrated circuit 503 is similar to operation of integrated circuit 303 during normal operation after initialization.

Figure 6:
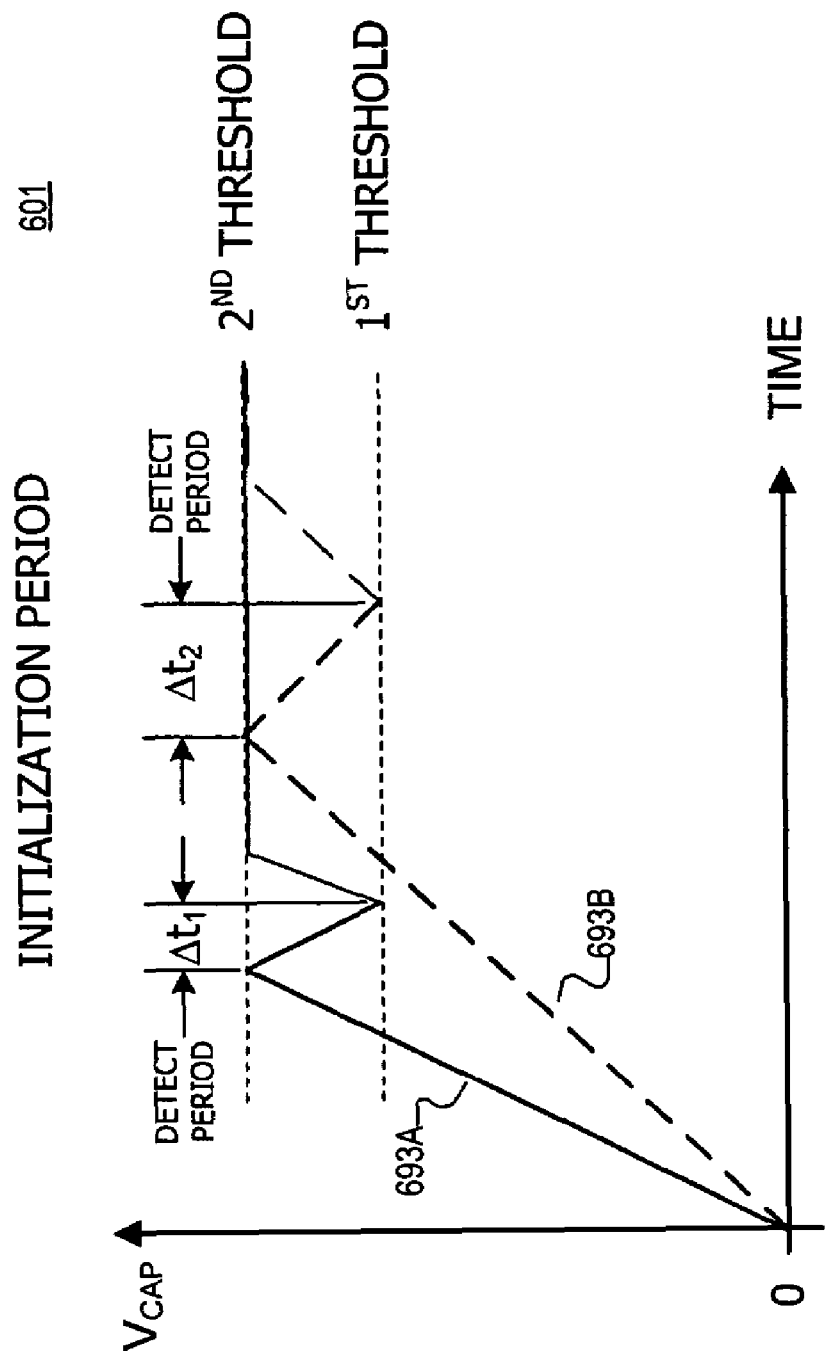
FIG. 6 is another graph showing a time measurement during an initialization period for an embodiment of an integrated circuit in accordance with the teaching of the present invention.

One difference between the integrated circuit 503 and integrated circuit 303 is that threshold detect and timing circuit 549 is coupled to measure the signal from multifunction capacitor as voltage $V_{CAP}$ 593 falls over time. To illustrate, attention is directed to both FIGS. 5 and 6. In particular, FIG. 6 shows a graph 601 that illustrates several examples of the voltage $V_{CAP}$ 593 over time during the initialization period of integrated circuit 503 in accordance with the teachings of the present invention. In particular, plot 693A illustrates voltage $V_{CAP}$ 593 for multifunction capacitor 511 having a first capacitance value and plot 693B illustrates voltage $V_{CAP}$ 593 for multifunction capacitor 511 having a second capacitance value. As can be observed, the rise and fall times of plots 693A and/or 693B change for a given current. In the illustrated example, the voltage $V_{CAP}$ 593 rises as multifunction capacitor is charged with charge current $I_{CHARGE}$ 561 while the voltage $V_{CAP}$ 593 falls as multifunction capacitor is discharged with current $I_{DETECT}$ through a discharging circuit comprising switch 597 and current source 595.

In operation during initialization, threshold detect and timing circuit 549 measures the signal received from multifunction capacitor 511 through bypass BP terminal 545. When threshold detect and timing circuit 549 detects that the voltage $V_{CAP}$ 593 has risen to the second threshold, threshold detect and timing circuit 549 closes switch 597 to enable current source 595 to discharge the multifunction capacitor 511 with current $I_{DETECT}$. At this time, the voltage $V_{CAP}$ 593 falls and the threshold detect and timing circuit 549 measures the time period it takes for the voltage $V_{CAP}$ 593 to fall from the second threshold voltage to the first threshold voltage. As can be observed in example FIG. 6, the time measurement for voltage $V_{CAP}$ 593 to fall in plot 693A from the second threshold to the first threshold is $\Delta t_1$. In contrast, the time measurement for voltage $V_{CAP}$ 593 to fall in plot 693B from the second threshold to the first threshold is $\Delta t_2$. As shown, the measured time period $\Delta t_2$ is greater than the measured time period $\Delta t_1$. This is because the capacitance value of multifunction capacitor 511 in plot 693B is greater than the capacitance value of multifunction capacitor 511 in plot 693A. Therefore, the particular capacitance value of multifunction capacitor 511 coupled to bypass BP terminal 545 may be estimated by threshold detect and timing circuit 549 by measuring the time period as shown in accordance with the teachings of the present invention. In this example, regulator 559 maintains the voltage $V_{CAP}$ 593 at the second threshold during normal operation.

Referring back to FIG. 5, parameter/mode selection circuit 551 is coupled to threshold detect and timing circuit 549 and generates parameter/mode selection signals for integrated circuit 503 in response to the time period measured or capacitance value estimated by threshold detect and timing circuit 549 in accordance with the teachings of the present invention. In the example illustrated in FIG. 5, parameter/mode selection circuit 551 selects specific settings for a current limit adjust signal ILIM ADJ 553, a thermal shutdown threshold signal THERMAL ADJ 555 and a frequency adjust signal FREQ ADJ 557 in response to the measured time period. The coupling and operation of these parameter/mode selection signals generated by parameter/mode selection circuit 551 in response to the measured time value is similar to the corresponding parameter/mode selection signals discussed in connection with integrated circuit 303 in accordance with the teachings of the present invention. It is appreciated that in an alternate embodiment the input 596 to circuit 549 could instead be coupled directly to the output 594 of bypass undervoltage comparator 571. Comparator 571 then forms part of the threshold detect and timing circuit 549. In this alternative embodiment input 596 to circuit 549 would no longer be coupled directly to BP terminal 545.

Figure 7:
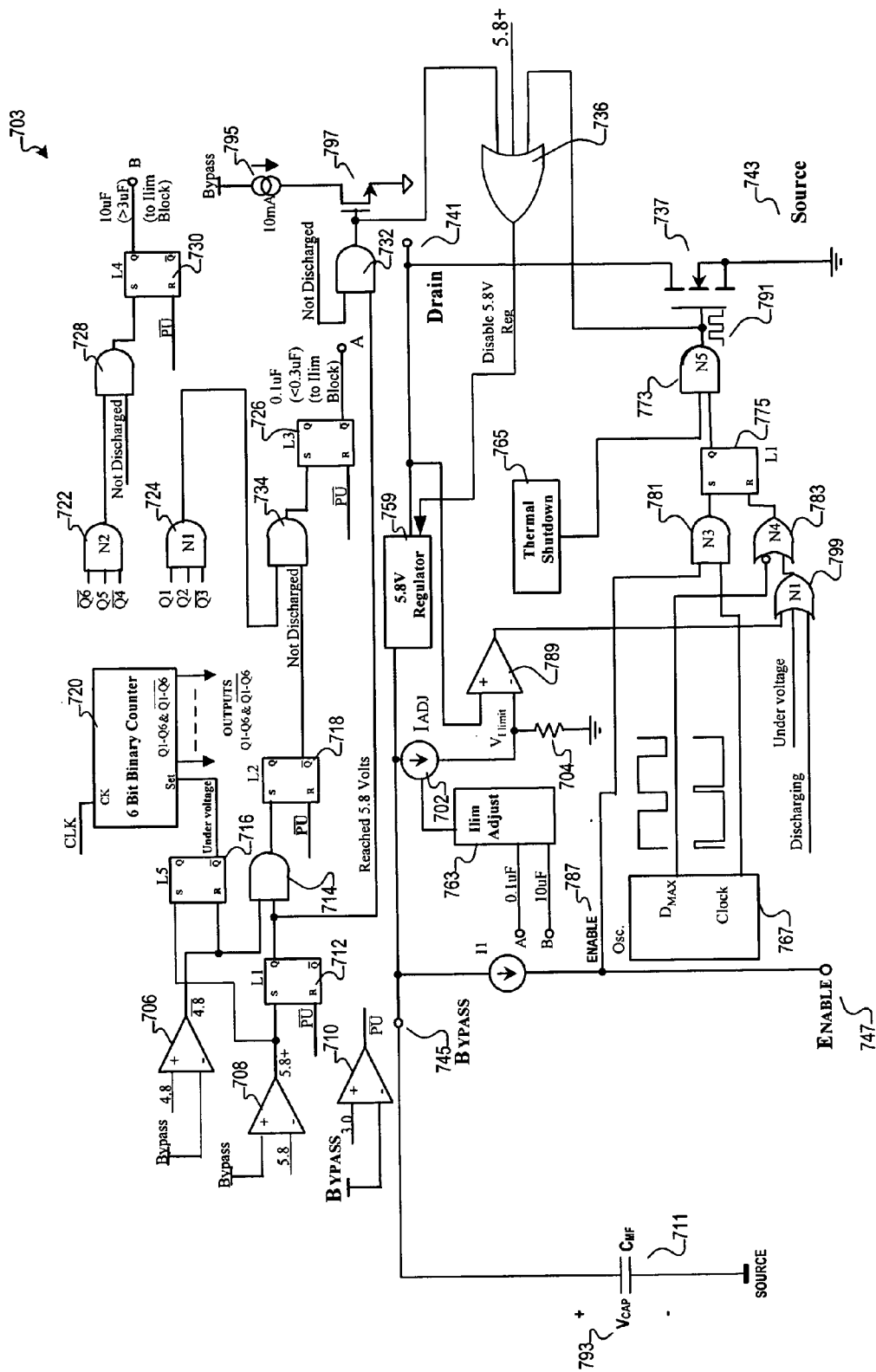
FIG. 7 is yet another schematic for an embodiment of an integrated circuit coupled to a multifunction capacitor from which a signal is measured during initialization to select a parameter/mode in accordance with the teaching of the present invention.

FIG. 7 is yet another schematic for an embodiment of an integrated circuit 703 coupled to a multifunction capacitor 711 from which a signal is measured during initialization to select a parameter/mode in accordance with the teaching of the present invention. Integrated circuit 703 also shares similarities with integrated circuits 503, 303, 203 and 103 discussed above. Accordingly, integrated circuit 703 may be used interchangeably or combined with elements with integrated circuits 503, 303, 203 and 103 where suitable in accordance with the teachings of the present invention.

In the specific example illustrated in FIG. 7 during initialization and at start up, the voltage $V_{CAP}$ 793 across multifunction capacitor 711 begins at substantially zero volts. At start up, multifunction capacitor 711 initially charged with the charge current received from regulator 759 through the bypass terminal 745. As soon as the voltage $V_{CAP}$ 793 at bypass terminal 745 exceeds 3.0 volts, as determined at comparator 710, the power up reset signal is removed at the output of comparator 710, which is coupled to reset all of the latches 712, 718, 726 and 730 as shown in FIG. 7 so that the start up sequence or initialization can be performed in accordance with the teachings of the present invention. During initialization parameters/modes of integrated circuit 703 may be selected based on the capacitance value $C_{MF}$ value of the multifunction capacitor 711 coupled to the bypass terminal 745.

Continuing with the initialization, as soon as the voltage $V_{CAP}$ 793 at bypass terminal 745 exceeds 5.8 volts, as determined at comparator 708, the Reached 5.8 Volts signal goes high as output from latch 712. With the Not Discharged signal high, the AND gate 732 is enabled and switch 797 is closed, thereby enabling current source 795 to begin discharging multifunction capacitor 711 through the bypass terminal 745. At this time, OR gate 736 disables the 5.8 volt regulator 759 and counter 720 also begins to count. In the illustrated example, counter 720 is a 6 bit binary counter and binary outputs Q1-Q6 are set according to the amount of time it takes for the voltage $V_{CAP}$ 793 to fall to 4.8 volts, as determined at comparator 706 and set according to the Undervoltage output of latch 716. The state of binary outputs Q1-Q6 at this time represent a time measurement from which the estimated capacitance value $C_{MF}$ of multifunction capacitor 711 may be determined in accordance with the teachings of the present invention. Latch 718 will be set and thus the Not Discharged signal will go low after $V_{CAP}$ 793 drops back down to 4.8 volts.

As shown in the illustrated example, binary outputs Q1-Q3 are input to AND gate 724 and binary outputs Q4-Q6 are input to AND gate 722. Depending on the state of binary outputs Q1-Q6, the outputs of latches 726 and 730 indicate whether the estimated capacitance value $C_{MF}$ of multifunction capacitor 711 is less than 0.3 μF or greater than 3 μF in accordance with the teachings of the present invention. If Q1, Q2 and Q3 reach values 1, 1 and 0 respectively, while Not Discharged signal is still high, latch 726 will be set, thus output signal A from latch 726 will be low, indicating a $C_{MF}$ value of greater than 0.3 uF. If Q1, Q2, Q3 reach values 0,1,0 respectively, while Not Discharged signal is still high, latch 730 will be set, thus output signal B from latch 730 will be high, indicating a $C_{MF}$ value of greater than 3 uF.

In the specific example illustrated in FIG. 7, the respective outputs A and B of latches 726 and 730 are input into the Ilim Adjust circuit 763 of integrated circuit 703. As shown, the Ilim Adjust circuit 763 adjusts the Iadj current source 702, which is used to adjust the voltage drop across resistor 704, which is used to set the comparison voltage $V_{Ilimit}$ for current limit comparator 789, which is coupled to detect the voltage drop and therefore the current through switch 737 in accordance with the teachings of the present invention. After initialization and during normal operation of integrated circuit 703, multifunction capacitor 711 provides integrated circuit supply decoupling function, similar to the other examples described above in accordance with the teachings of the present invention.

In the foregoing detailed description, the methods and apparatuses of the present invention have been described with reference to a specific exemplary embodiment thereof. It will, however, be evident that various modifications and changes may be made thereto without departing from the broader spirit and scope of the present invention. The present specification and figures are accordingly to be regarded as illustrative rather than restrictive.

What is claimed is:

1. A method, comprising:
   estimating a capacitance value of a multifunction capacitor coupled to an integrated circuit during an initialization period of the integrated circuit;
   selecting a parameter/mode of the integrated circuit in response to the estimated capacitance value;
   receiving a bias current from the multifunction capacitor after the initialization period; and
   operating the integrated circuit while utilizing the received bias current from the multifunction capacitor to provide power to operate the integrated circuit.

2. The method of claim 1 wherein estimating the capacitance value comprises:
   charging the multifunction capacitor during the initialization period of the integrated circuit; and
   measuring a time period for a voltage on the multifunction capacitor to change from a first value to a second value.

3. The method of claim 2 wherein measuring the time period for the voltage on the multifunction capacitor to change from the first value to the second value comprises charging the multifunction capacitor with a predetermined current to increase the voltage on the multifunction capacitor during the time period.

4. The method of claim 2 wherein measuring the time period for the voltage on the multifunction capacitor to change from the first value to the second value comprises discharging the multifunction capacitor with a predetermined current to decrease the voltage on the multifunction capacitor during the time period.

5. The method of claim 2 wherein selecting the parameter/mode of the integrated circuit comprises selecting the parameter/mode of the integrated circuit in response to the measured time period for the voltage on the multifunction capacitor to change from the first value to the second value.

6. The method of claim 1 wherein operating the integrated circuit comprises regulating a transfer of energy from an input of a power supply to an output of the power supply with the integrated circuit.

7. A power supply, comprising:
   an energy transfer element coupled between an input and an output of the power supply;
   a switch coupled to the input of the energy transfer element;

a controller coupled to the switch to control switching of the switch to regulate a transfer of energy from the input of the power supply to the output of the power supply; and a multifunction capacitor coupled to the controller, the controller to estimate a capacitance value of the multifunction capacitor during an initialization period of the controller, the controller to set a parameter/mode for the controller in response to the estimated capacitance value, the controller to receive a bias current from the multifunction capacitor after the initialization period for providing power to operate the controller.

8. The power supply of claim 7 wherein the controller comprises:

a threshold detection and timing circuit coupled to measure a signal from the multifunction capacitor; and a selection circuit coupled to the threshold detection and timing circuit to select the parameter/mode for the controller in response to the measured signal from the multifunction capacitor.

9. The power supply of claim 8 wherein the signal measured by the threshold detection and timing circuit comprises a time for a voltage across the multifunction capacitor to change from a first voltage to a second voltage.

10. The power supply of claim 9 wherein the controller is coupled to set the parameter/mode for the controller in response to the time measurement.

11. The power supply of claim 9 wherein the first voltage is greater than the second voltage.

12. An integrated control circuit for a power supply, comprising:

a terminal to be coupled to a capacitor of the power supply;

a threshold detect and timing circuit coupled to the terminal to determine a capacitance value of the capacitor during a time period; and a parameter/mode selection circuit coupled to the threshold detect and timing circuit to determine one of a plurality of parameters/modes of the integrated circuit during the time period in response to the capacitance value, wherein the integrated control circuit selectively receives a bias current at the terminal from the capacitor to provide power to operate the integrated circuit after the time period has ended.

13. The integrated control circuit of claim 12, wherein the capacitor provides a supply decoupling function for the integrated control circuit.

14. The integrated control circuit of claim 12, wherein the capacitor provides a loop compensation function for the integrated control circuit.

15. The integrated control circuit of claim 12, wherein the terminal is a first terminal and wherein the parameter/mode that is determined by the parameter/mode selection circuit during the time period comprises a peak current limit level in a switch that is coupled between a second terminal and a third terminal of the integrated circuit.

16. The integrated control circuit of claim 15, wherein the capacitor is to be coupled between the first terminal and the third terminal.

17. The integrated control circuit of claim 12, wherein the parameter/mode that is determined by the parameter/mode selection circuit during the time period comprises an operating frequency of the integrated circuit.

18. The integrated control circuit of claim 17, wherein the operating frequency of the integrated control circuit is a maximum operating frequency of the integrated circuit.

19. The integrated control circuit of claim 12, further comprising a regulator circuit coupled to the terminal, the regulator circuit to charge the capacitor coupled to the terminal during the time period.

20. The integrated control circuit of claim 19, wherein the regulator circuit comprises a current source to charge the capacitor with a predetermined current.

21. The integrated control circuit of claim 19, further comprising a discharging circuit coupled to reduce the charge in the capacitor during the time period.

22. The integrated control circuit of claim 12, wherein the threshold detect and timing circuit determines the capacitance value of the capacitor in response to a measurement of time that a voltage at the terminal changes from a first voltage to a second voltage.

23. The integrated control circuit of claim 22, wherein the first voltage is less than the second voltage.

* * * * *

UNITED STATES PATENT AND TRADEMARK OFFICE
CERTIFICATE OF CORRECTION

PATENT NO.        : 7,425,834 B2
APPLICATION NO.   : 11/213252
DATED             : September 16, 2008
INVENTOR(S)       : Matthews et al.

It is certified that error appears in the above-identified patent and that said Letters Patent is hereby corrected as shown below:

On the Title Page, Item (56)
In Item [56], under Other Publications, line 7, please delete "TinySwithc" and insert -- TinySwitch --.

Signed and Sealed this

Ninth Day of December, 2008

JON W. DUDAS
*Director of the United States Patent and Trademark Office*